(12) United States Patent
Kuribayashi et al.

(10) Patent No.: US 6,658,054 B1
(45) Date of Patent: Dec. 2, 2003

(54) WAVEFORM EQUALIZER AND DATA REPRODUCING APPARATUS USING THE SAME

(75) Inventors: Hiroki Kuribayashi, Tsurugashima (JP); Shogo Miyanabe, Tsurugashima (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/262,352

(22) Filed: Mar. 4, 1999

(30) Foreign Application Priority Data

Mar. 6, 1998 (JP) ............................................ 10-055483

(51) Int. Cl.⁷ ............................ H03H 7/30; H03H 7/40; H03K 5/159
(52) U.S. Cl. ........................ 375/232; 375/230; 360/65; 708/323
(58) Field of Search ................................ 375/229, 230, 375/232, 233, 234, 350; 708/300, 301, 313, 316, 319, 320, 322, 323; 333/18, 28 R, 28 T, 165, 166; 360/65; 369/59.17, 124.15

(56) References Cited

U.S. PATENT DOCUMENTS 5,768,313 A * 6/1998 Kuribayashi ................. 375/232
6,167,008 A * 12/2000 Kuribayashi .............. 369/44.32

* cited by examiner

Primary Examiner—Phoung Phu
(74) Attorney, Agent, or Firm—Morgan, Lewis & Bockius LLP

(57) ABSTRACT

A waveform equalizer which can improve a quality of a read signal by certainly correcting asymmetry in the read signal and a data reproducing apparatus using the waveform equalizer. The waveform equalizer performs a waveform equalization to the read signal and is constructed by: inclination discriminating means for detecting an ascending slope portion and a descending slope portion of the read signal; a filter for performing a filtering process to the read signal; and characteristics switching means for switching frequency characteristics of the filter in accordance with a discrimination output of the inclination discriminating means.

10 Claims, 11 Drawing Sheets

WAVEFORM EQUALIZER AND DATA REPRODUCING APPARATUS USING THE SAME

BACKGROUND OF THE INVENTION

1. Field of the Invention

The invention relates to a waveform equalizer and, more particularly, to a waveform equalizer for performing a waveform equalization to a read signal read out from a recording medium. The invention also relates to a data reproducing apparatus using the waveform equalizer.

2. Description of Related Art

Optical disc record information reproducing apparatuses are widely used as one type of recording medium reading systems. A known technique in this field is that a photoelectric conversion output of reflection light from an optical disc which is derived by irradiating read light to the optical disc is obtained as an RF signal or a read signal, a waveform of the read signal is corrected by a waveform equalizer, a waveform interference is reduced, and thereafter, a binarizing process is performed, thereby generating a digital read signal.

In this technique, asymmetry of the read signal can be corrected at the time of the binarizing process.

More specifically, there are a variation in power of the recording light which is used for mastering at the time of the recording information to an optical disc and a variation in a length of pit as a recording mark which is actually formed on the optical disc by the recording light. When the recording optical power is not proper, there generally occurs a phenomenon such that each pit which is formed becomes longer or shorter little by little by the same length than the standard length at the positions before and after the length direction. That is, the symmetry between the pit and the nonpit portion cannot be maintained. Such a phenomenon is termed asymmetry.

Figure 1:
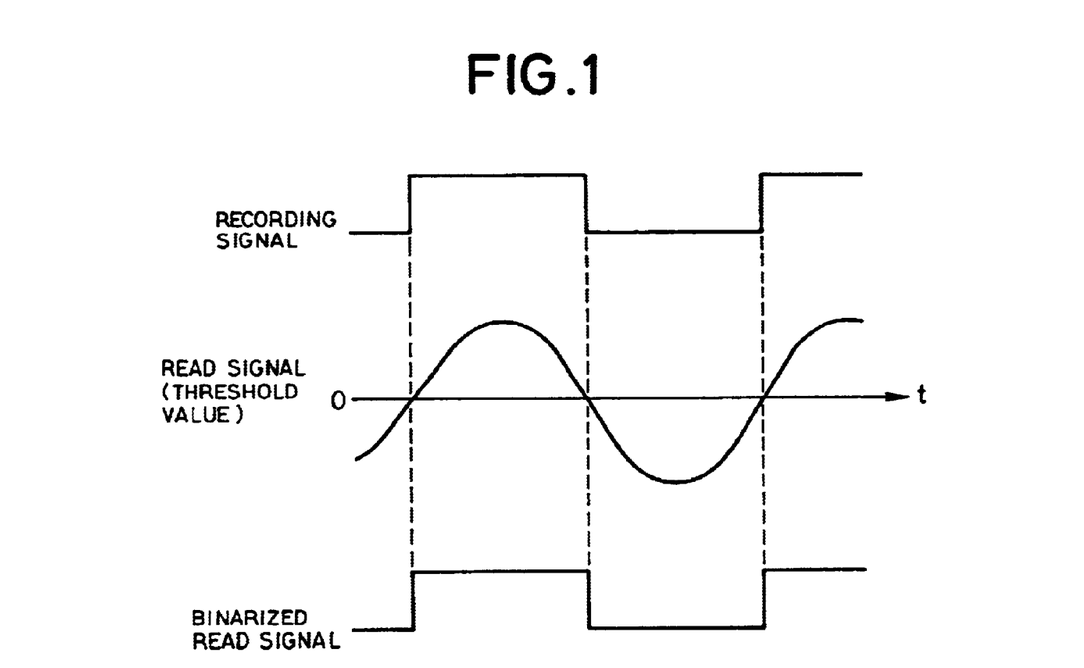
FIG. 1 is a time chart showing a state of reading a recording signal having no asymmetry.

FIG. 1 shows a state where a read signal obtained by reading a recording signal without asymmetry is binarized on the basis of a predetermined threshold value (in this example, zero). In this case, proper binary read signals having a duty ratio 50% corresponding to the recording signal are obtained in both of a high level portion and a low level portion.

Figure 2:
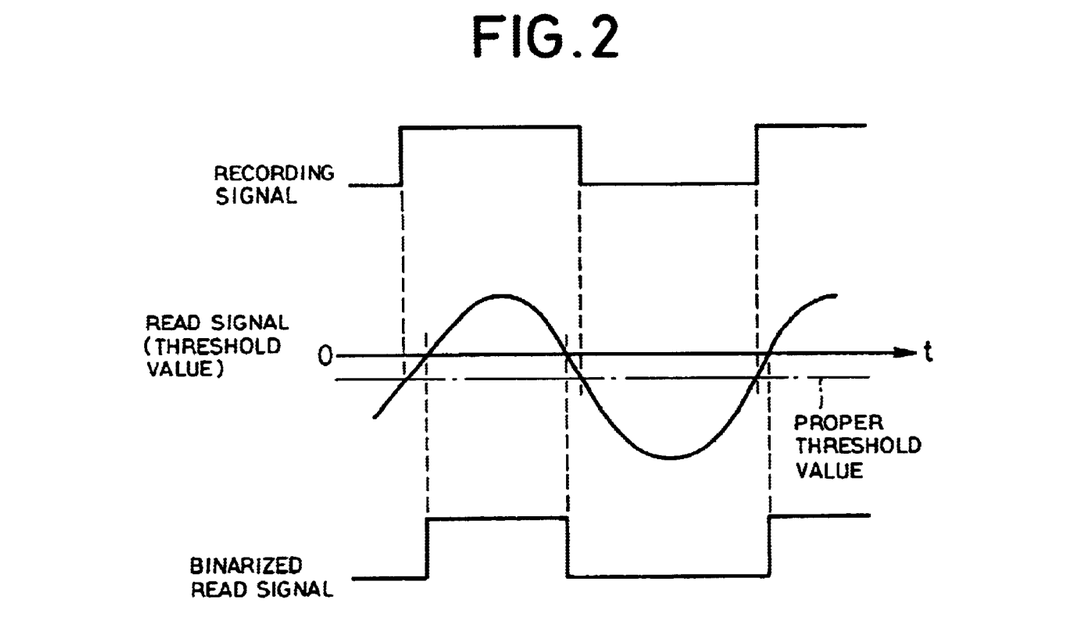
FIG. 2 is a time chart showing a state of reading a recording signal having asymmetry.

FIG. 2 shows a case that a recording signal with asymmetry is read. Since the read signal in which the threshold value is shifted from a proper value is obtained, if the signal is binarized by the same threshold value as that in FIG. 1, the duty radio becomes shifted and an improper binary read signal is produced in which the high level portion and the low level portion do not correspond to the recording signal.

The asymmetry cannot be completely suppressed in a mass producing step of optical discs. The asymmetry of the read signal itself in a disc reading system also fluctuates depending on the wavelength of a read laser beam of an optical pickup being used.

A disc of a CD (compact disc) system has been standardized so that asymmetry lies within a certain range. In the reading system, the asymmetry is automatically corrected by using the nature of a read signal which is presumed in accordance with the CD system. In more detail, there used is a method of tracking-detecting the center of an eye pattern of a read signal and binarizing the read signal by using the detected center level as a threshold value by using a nature such that the DC component of the EFM (Eight to Fourteen Modulation) signal itself which is recorded to the CD is equal to zero, a length of continuation (what is called a run length) of logical value "0" or "1" of the data by the EFM is limited to a length within a range of 3T to 11T (1T is equal to a period of one channel bit), and the like.

Hitherto, it is considered that a tracking ability of the eye pattern in the above method is sufficient for the disc of the CD system.

However, in the case of discs having a capacity larger than that of the CD and the recording of a higher density is performed such as a DVD (Digital Video disc or Digital Versatile disc) or the like which are progressively being put into practical use, a pit length corresponding to each run length of the recording data is fairly shorter than that of the CD and there is a case where the eye pattern tracking ability by the above method is insufficient.

Explanation will now be made with respect to the 8/16 modulation of the DVD as an example. In the case of recording by setting the pit length to a short length, if a recording power is deviated from the optimum value, the center of the eye pattern of a signal of 3T as a minimum run length in the read signal is deviated from the center of the eye pattern of a signal of 4T or more, so that the read signal deteriorates. The eye pattern center corresponds to a threshold value such that a pulse width of the signal obtained by binarizing the read signal is equal to a pulse width of the recording signal.

Figure 3:
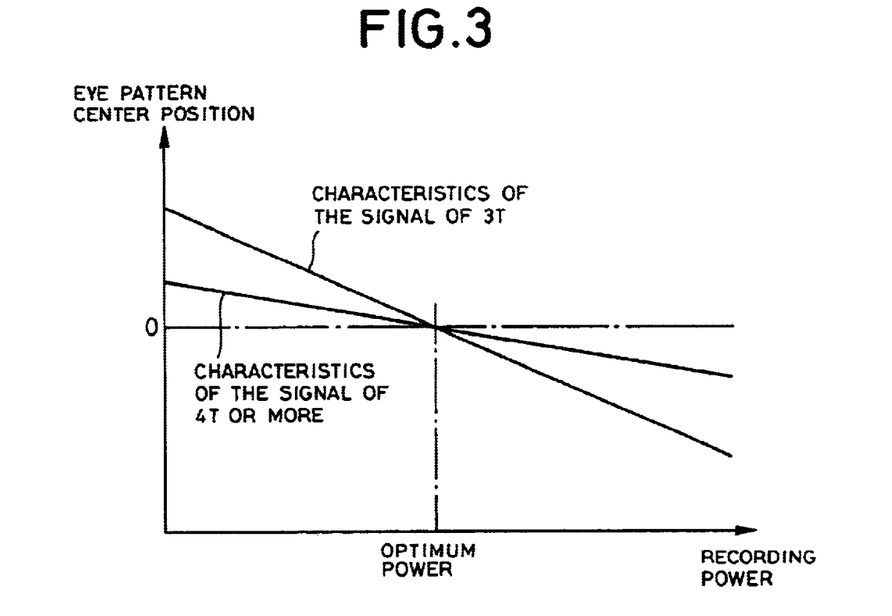
FIG. 3 is a graph showing the relation between a recording power to a disc and a center position of an eye pattern of a read signal.

A change of the center of the eye pattern for the recording power is now schematically shown in FIG. 3. Since the signal of 3T is near the limit of a resolution of an LBR (laser beam recorder) as a signal recording system to the optical disc, the center position of the eye pattern of the signal of 3T changes sensitively for the recording power. That is, the signal of 3T has a characteristic of a large inclination as shown in the figure.

On the other hand, since the signal of 4T or more has a surplus in the resolution of the LBR, a change of the center of the eye pattern of the signal of 4T or more for the recording power is gentle.

Figure 4A:
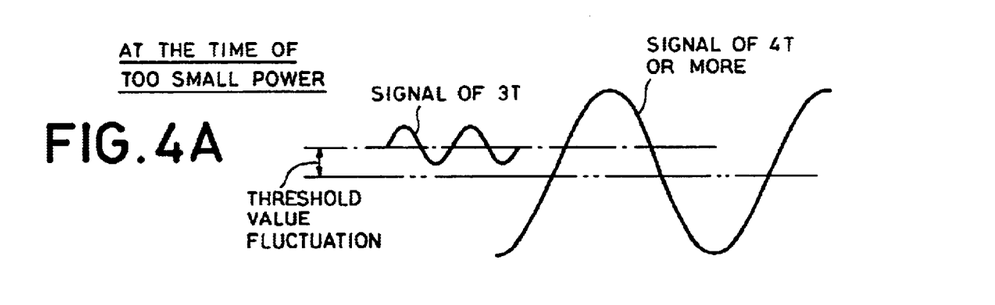
FIGS. 4A and 4B are waveform diagrams showing a difference between a signal of 3T and a signal of 4T or more in the case of reading the recording signal by a too small recording power and a too large recording power.
Figure 4B:
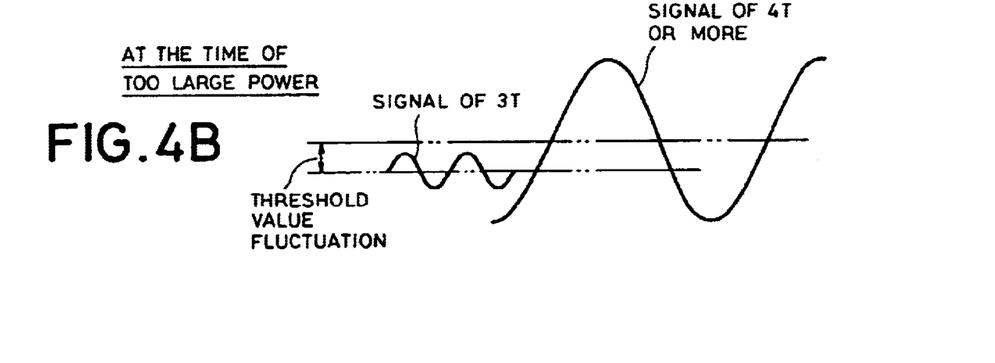

When the recording power is smaller than the optimum value, therefore, the center of the eye pattern of the signal of 3T is brighter than the center of the eye pattern of the signal of 4T or more (near the mirror level). That is, as shown in FIG. 4A, when the recording power is too small, a proper threshold value of the signal of 3T becomes higher than that of the signal of 4T or more, for the time of binarization of the read signal. When the recording power is larger than the optimum value, the center of the eye pattern of the signal of 3T is darker than the center of the eye pattern of the signal of 4T or more. That is, as shown in FIG. 4B, at the time of a too large recording power, upon binarization of the read signal, a proper threshold value of the signal of 3T is lower than that of the signal of 4T or more.

When the signal of 3T and the signal of 4T or more are binarized by the same threshold value, therefore, the deviation of the center of the eye pattern of the signal of 3T, namely, becomes the deviation of the duty due to the asymmetry, thereby causing a jitter to occur in the read signal.

As mentioned above, the center of the eye pattern of the signal of 3T mainly representing the shortest pit sensitively changes for the recording power due to the lack of resolution of the LBR, so that a margin of the recording power is narrowed. A fact that the signal indicative of the shortest pit exerts a large influence on the quality of the read signal to an extent which cannot be ignored becomes a problem which was not found in the CD or the like.

In the case of recording media of the WORM type and the rewritable type, since the recording medium itself which is used and a recording apparatus, and further, a recording environment depend on each user, it is presumed that asymmetry occurs due to a variation of the recording power. It is extremely important to cope with the asymmetry in order to maintain high playability on products.

SUMMARY AND OBJECTS OF THE INVENTION

The invention is made in consideration of the foregoing points and it is an object of the invention to provide a waveform equalizer which can improve a quality of a read signal by certainly correcting asymmetry in the read signal and to provide a data reproducing apparatus using the waveform equalizer.

According to the invention, there is provided a waveform equalizer for performing a waveform equalization to a read signal, comprising: inclination discriminating means for discriminating an ascending slope portion and a descending slope portion of the read signal; a filter for performing a filtering process to the read signal; and characteristics switching means for switching frequency characteristics of the filter in accordance with a discrimination output of the inclination discriminating means.

In the waveform equalizer with the above construction, the filter has a first filter in which frequency characteristics for the ascending slope portion are set and a second filter in which frequency characteristics for the descending slope portion are set, and the characteristics switching means can select an output signal of either one of the first and second filters and use the selected output signal as an output signal of the waveform equalizer.

The filter is an FIR filter and the characteristics switching means can switch the frequency characteristics by changing values of tap coefficients of the FIR filter.

Further, the frequency characteristics under the discrimination of the ascending slope portion can be set in accordance with a sampling value near a zero-cross point in the ascending slope portion of the corresponding read signal and the frequency characteristics under the discrimination of the descending slope portion can be set in accordance with a sampling value near a zero-cross point in the descending slope portion of the corresponding read signal.

According to the invention, there is provided a data reproducing apparatus for obtaining reproduction data by binarizing a read signal read out from a recording medium, comprising: sampling means for forming a sampling value series read signal by sampling the read signal; a waveform equalizer including inclination discriminating means for discriminating an ascending slope portion and a descending slope portion of the sampling value series read signal, a filter for performing a filtering process to the sampling value series read signal, and characteristics switching means for switching frequency characteristics of the filter in accordance with a discrimination output of the inclination discriminating means; and binarizing means for forming the reproduction data by binarizing an output signal of the waveform equalizer.

DETAILED DESCRIPTION OF THE PREFERRED EMBODIMENTS

The invention will now be described in detail hereinafter with reference to the drawings.

Figure 5:
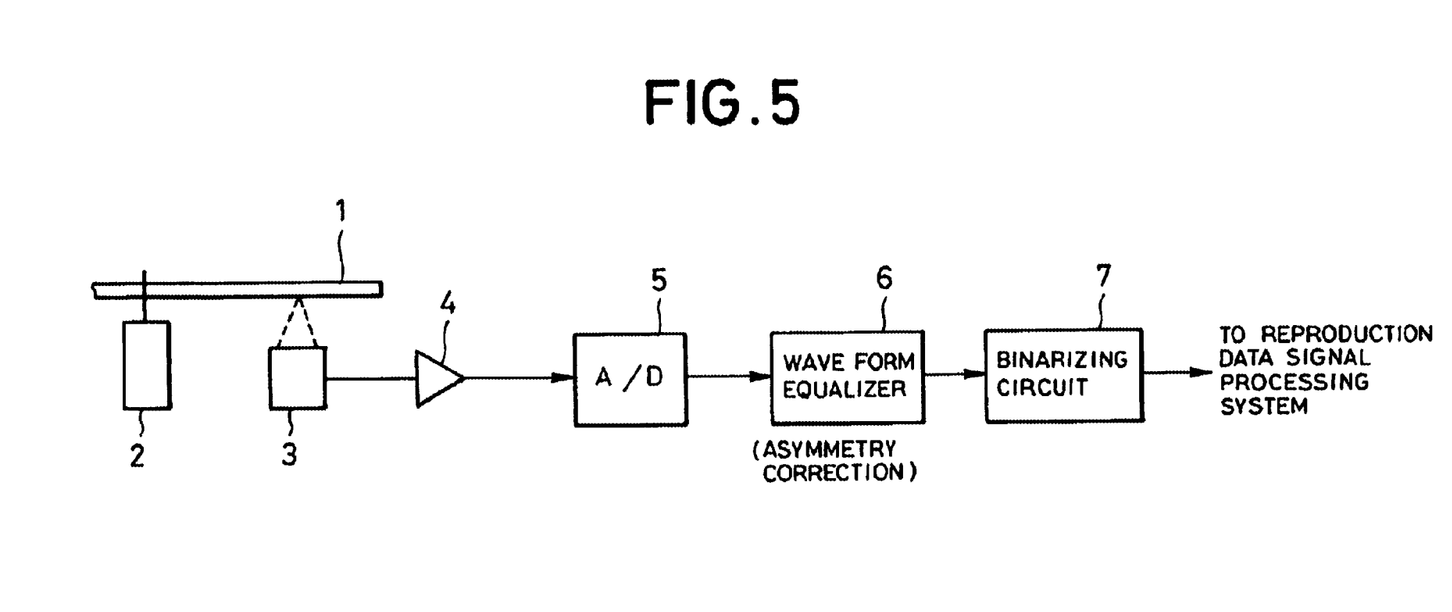
FIG. 5 is a schematic block diagram of a data reproducing apparatus to which a waveform equalizer of an embodiment according to the invention is applied.

FIG. 5 shows a schematic construction of a disc recording information reproducing apparatus to which a waveform equalization according to the invention is applied.

In FIG. 5, while an optical disc 1 as a recording medium is rotated by a spindle motor 2, read light is irradiated to the disc by an optical pickup 3. On the recording surface of the disc 1, the read light is subjected to an optical modulation according to, for example, a pit as recording information or recording mark and the modulated light is returned as reflection light including a recording information component to the pickup 3. The pickup 3 receives the reflection light and generates an electric signal according to its photosensing level or photosensing state as an RF signal or a read signal.

The read signal from the pickup 3 is supplied to an A/D converter 5 through an RF amplifier 4. The A/D converter 5 converts an input analog read signal to a digital signal at a predetermined sampling rate in accordance with the number of quantization bits. By this digitization, a read signal of a sampling value series (hereinafter, also properly abbreviated to "read signal") is formed.

The read signal from the A/D converter 5 is supplied to a waveform equalizer 6. The waveform equalizer 6 serves as one of main features of the present invention and has a function to correct asymmetry. The details will be described hereinlater. An output signal of the waveform equalizer 6 is supplied to a binarizing circuit 7. The read signal binarized as a data series of logical values "1" and "0" by the binarizing circuit 7 is supplied as a reproduction data signal to a reproduction data signal processing system (not shown).

The waveform equalizer 6 will now be described in detail.

First, a fundamental construction and an operation principle of the waveform equalizer will be described.

Figure 6:
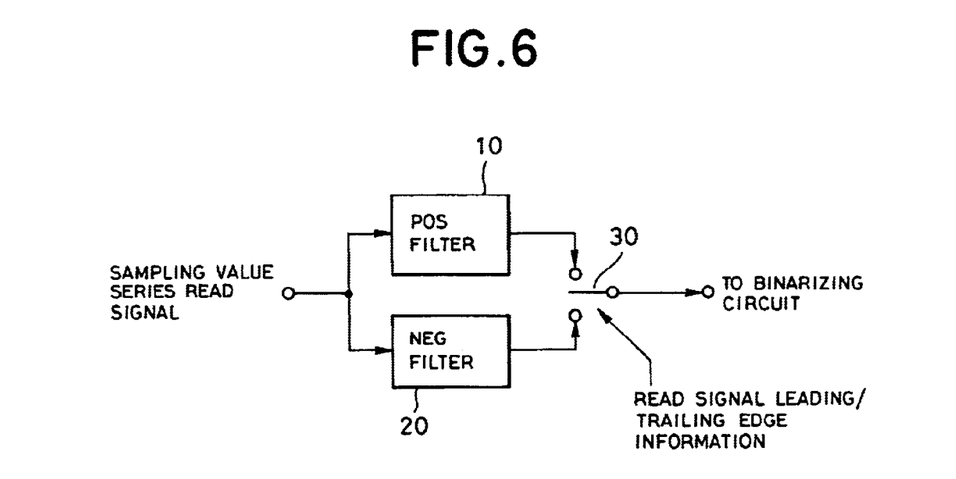
FIG. 6 is a block diagram showing a fundamental construction of the waveform equalizer of the embodiment according to the invention.

In FIG. 6, the waveform equalizer is constructed by: a POS filter 10 as a first filter to which the read signal as a sampling value series is supplied from the A/D converter 5; an NEG filter 20 as a second filter; and a selecting circuit 30 to select either one of outputs of the filters 10 and 20.

The POS filter 10 includes an FIR filter and adaptively controls tap coefficients of the filter on the basis of a deviation of a sampling value signal near a zero-cross point in the read signal from zero. The NEG filter 20 also includes an FIR filter and adaptively controls tap coefficients of the filter on the basis of a deviation of a sampling value signal near a zero-cross point in the read signal from zero.

The POS filter 10, however, controls the tap coefficients by using the sampling value signal near the zero-cross point in a level ascending slope portion (hereinafter, abbreviated to a "leading edge") of the read signal waveform and the NEG filter 20 controls the tap coefficients by using the sampling value signal near the zero-cross point in a level descending slope portion (hereinafter, abbreviated to a "trailing edge") of the read signal waveform.

The selecting circuit 30 is controlled so as to relay the output signal of the POS filter 10 to the binarizing circuit (or 0/1 discriminating circuit) 7 at the post stage when the read signal shows the leading edge and to relay the output signal of the NEG filter 20 to the binarizing circuit 7 when the read signal indicates the trailing edge. That is, the selection switching operation of the selecting circuit 30 is performed in accordance with leading edge/trailing edge identification information of the read signal.

According to the above construction, asymmetry can be corrected on the basis of the following principle.

Figure 7A:
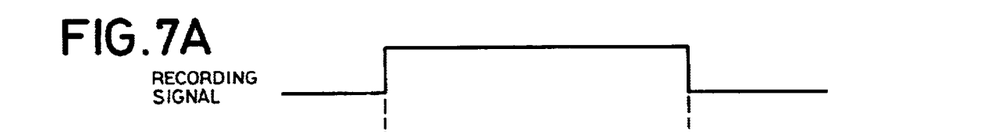
FIGS. 7A and 7B are waveform diagrams showing an asymmetry correcting state by the waveform equalizer in FIG. 6.
Figure 7B:
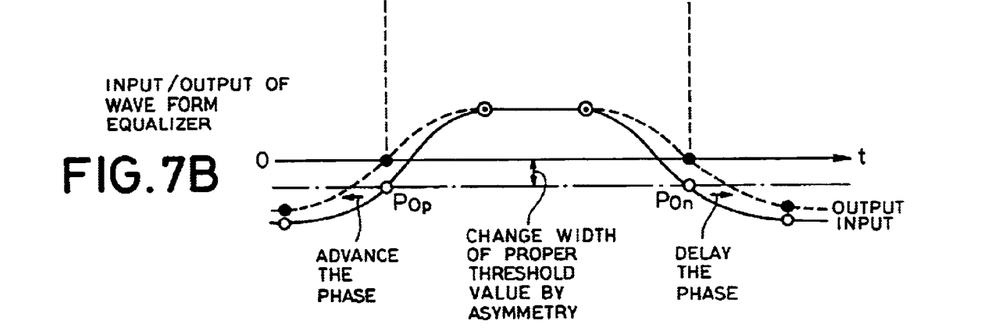

For example, as shown in FIGS. 7A and 7B, a case where the center of an eye pattern of the signal of 3T in the read signal is deviated to the lower side than the reference position (read signal shown by space circles will now be considered. In this case, when the read signal is binarized by using the zero level corresponding to the reference position as a threshold value, the leading edge (zero-cross point of the level ascending portion) of the binarized read signal is delayed from the leading edge of the recording signal. The trailing edge (zero-cross point of the level descending portion) of the binarized read signal is advanced from the trailing edge of the recording signal.

By switching frequency characteristics (characteristics of the delay and/or amplitude) of the filters in the leading edge portion and the trailing edge portion, as shown by the read signal indicated by painted circles, the phase of the signal portion of the leading edge is advanced and the phase of the signal portion of the trailing edge is delayed, thereby correcting the deviation of the asymmetry (duty).

When the center of the eye pattern is deviated upward, by reversing the shifting direction of the phase for each edge portion, the asymmetry can be corrected.

As mentioned above, it is possible to recognize such that in the leading edge (POS edge) and the trailing edge (NEG edge) of the read signal, the signal has jitter components in which the directions to shift the phase differ. To remove the jitter component in correspondence to each edge, therefore, the characteristics of the POS filter 10 and NEG filter 20 are set and are switched in correspondence to the edges, thereby performing the waveform equalization for the proper correction of the asymmetry.

A change width of the proper threshold value due to the asymmetry as shown in FIGS. 7A and 7B almost corresponds to an amount by which sampling values P0p and P0n near the zero-cross point in both of the leading and trailing edges should be phase-shifted. By detecting the sampling values P0p and P0n, therefore, and setting the characteristics of each filter in accordance with detection values, the proper asymmetry correction is accomplished.

A construction of a specific waveform equalizer will now be described.

Figure 8:
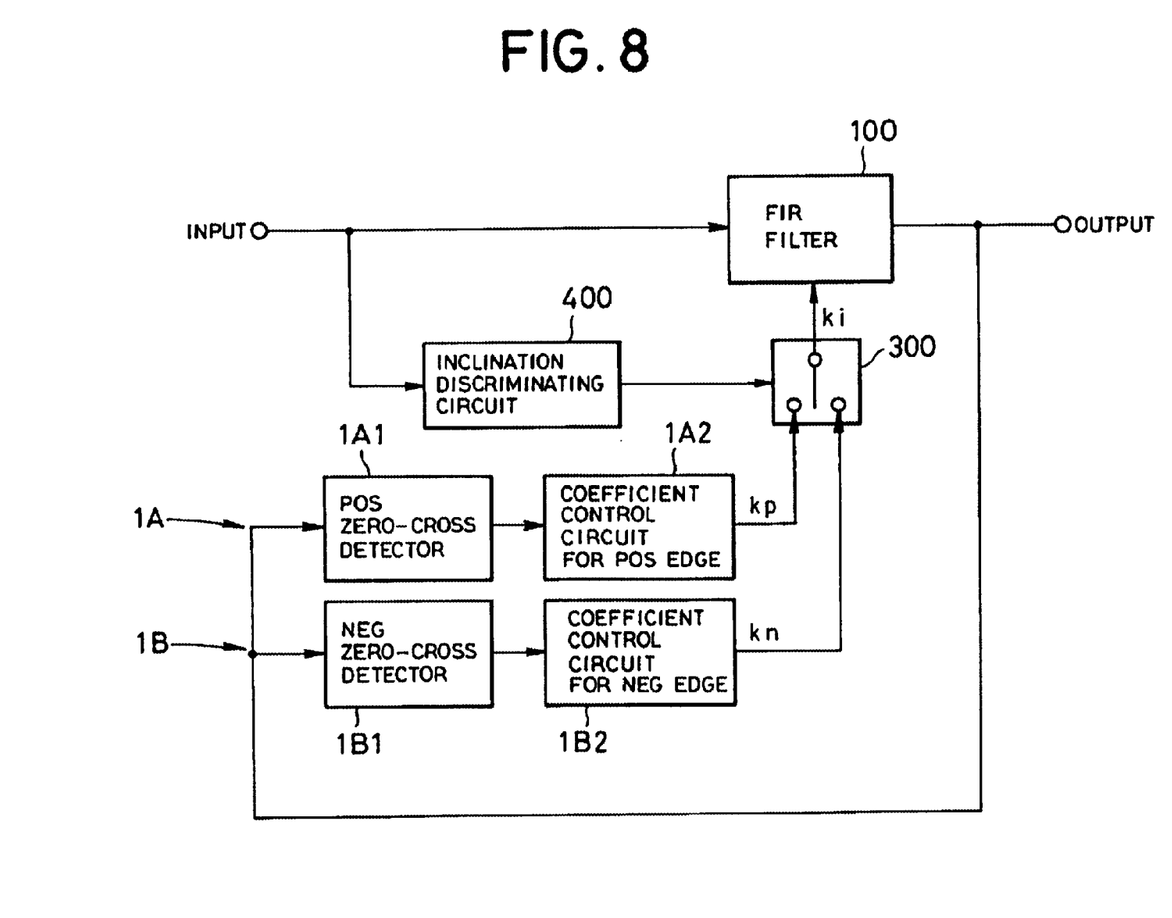
FIG. 8 is a block diagram showing a schematic construction of a waveform equalizer according to the first embodiment constructed in accordance with the construction of FIG. 6.

FIG. 8 shows a construction of a waveform equalizer according to the first embodiment. The read signal converted to a sampling value series by the A/D converter 5 is supplied to an FIR filter 100.

Figure 9:
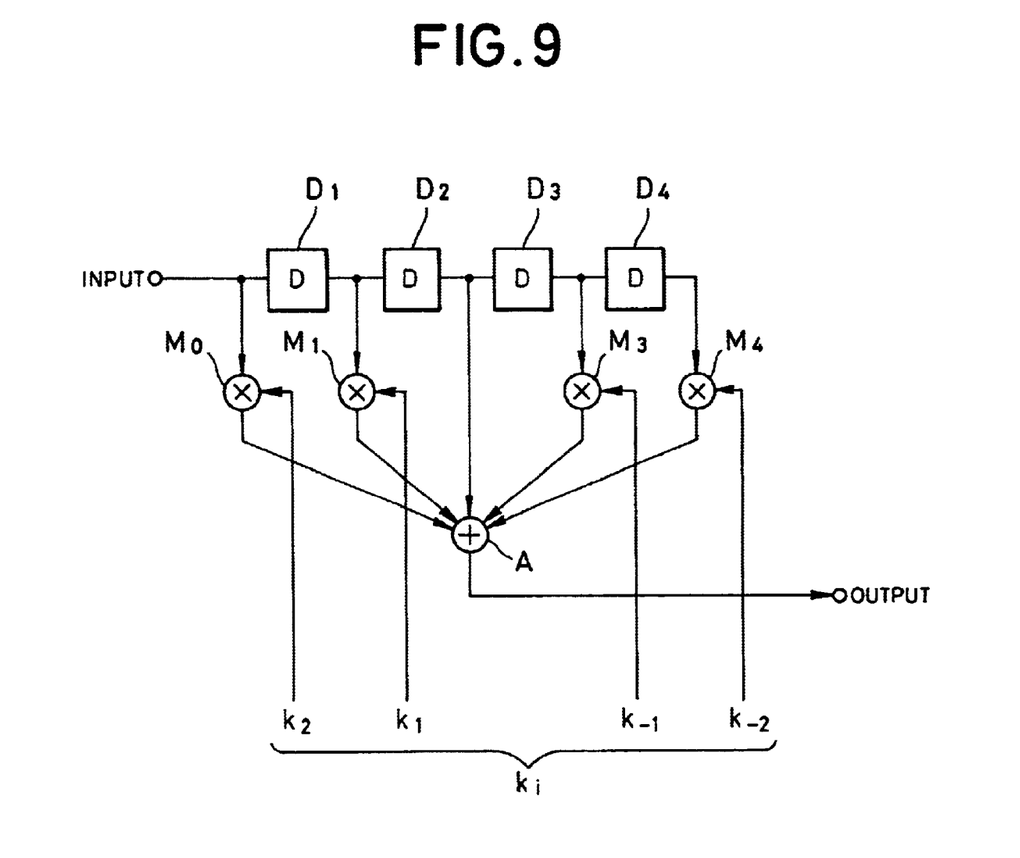
FIG. 9 is a block diagram showing a construction of an FIR filter in the waveform equalizer of FIG. 8.

The FIR filter 100 is constructed as shown in FIG. 9.

That is, the read signal converted to the sampling value series, namely, a digital signal of a predetermined number of quantization bits of every sampling period is supplied to a system of five stages comprising unit delay element groups D1 to D4 which are cascade connected. The unit delay element groups D1 to D4 give a time delay which is equal to a sampling period of an input signal and an output of one unit delay element group becomes an input of one sampling time before. Each tap output, namely, the input signal and an output signal of each unit delay element group are individually supplied as one input to each of multipliers M0, M1, M3, and M4.

Values of tap coefficients ki: {k2, k1, k-1, k-2} are supplied to the other inputs of the multipliers M0, M1, M3, and M4, respectively. Multiplication results by the multipliers M0, M1, M3, and M4 are added by an adder A and an addition result is extracted as an output signal of the FIR filter 100, namely, as a read signal after the waveform equalization.

Either ones of tap coefficients kp for POS controlled by a first filter control system 1A comprising a POS zero-cross detector 1A1 and a coefficient control circuit 1A2 for a POS edge and tap coefficients kn for NEG controlled by a second filter control system 1B comprising an NEG zero-cross detector 1B1 and a coefficient control circuit 1B2 for an NEG edge as shown in FIG. 8 are selected by a selecting circuit 300 and are used as tap coefficients ki.

On the basis of a correlation between a sampling value that is the closest to a zero-cross point in a POS edge portion detected by the POS zero-cross detector 1A1 and each corresponding tap output, the tap coefficients kp for POS are set to values such that the sampling value that is the closest to the zero-cross point is converged to zero by the coefficient control circuit 1A2 for a POS edge.

On the basis of a correlation between a sampling value that is the closest to a zero-cross point in an NEG edge portion detected by the NEG zero-cross detector 1B1 and each corresponding tap output, the tap coefficients kn for NEG are set to values such that the sampling value that is the closest to the zero-cross point is converged to zero by the coefficient control circuit 1B2 for an NEG edge.

As the calculating method of the coefficients, reference can be made, for example, to Japanese Patent Kokai No. 9-321671.

The switching operation of the selecting circuit 300 Is performed by an inclination discriminating circuit 400. That is, the inclination discriminating circuit 400 detects whether the read signal indicates the leading edge or the trailing edge, generates a control signal corresponding to a detection result, and instructs the selecting circuit 300 to select which one of the filter control systems.

If the read signal indicates the leading edge, therefore, the selecting circuit 300 selects the first filter control system 1A and the values of the coefficients kp from the coefficient control circuit 1A2 for a POS edge are transmitted as coefficients ki to the FIR filter 100. If the read signal indicates the trailing edge, therefore, the selecting circuit 300 selects the second filter control system 1B and the values of the coefficients kn from the coefficient control circuit 1B2 for an NEG edge are transmitted as coefficients ki to the FIR filter 100.

The FIR filter 100, consequently, can perform a phase shift corresponding to the leading edge portion and the trailing edge portion and corresponding to the proper threshold value fluctuation amount and direction as described with reference to FIGS. 7A and 7B and can generate the read signal in which the asymmetry has been corrected as a waveform equalization output.

Figure 10:
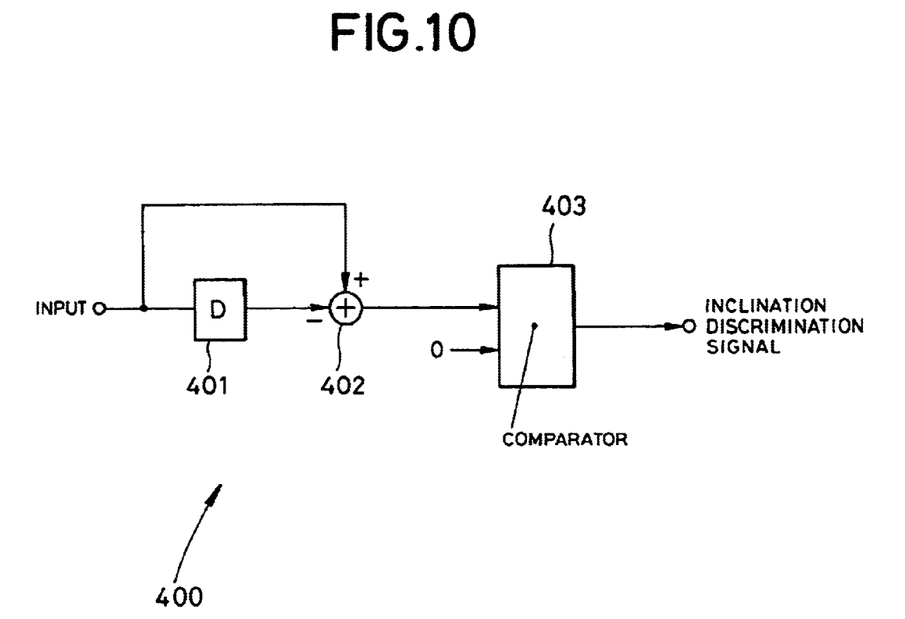
FIG. 10 is a block diagram showing an example of a construction of an inclination discriminating circuit in the waveform equalizer FIG. 8.
Figure 11A:
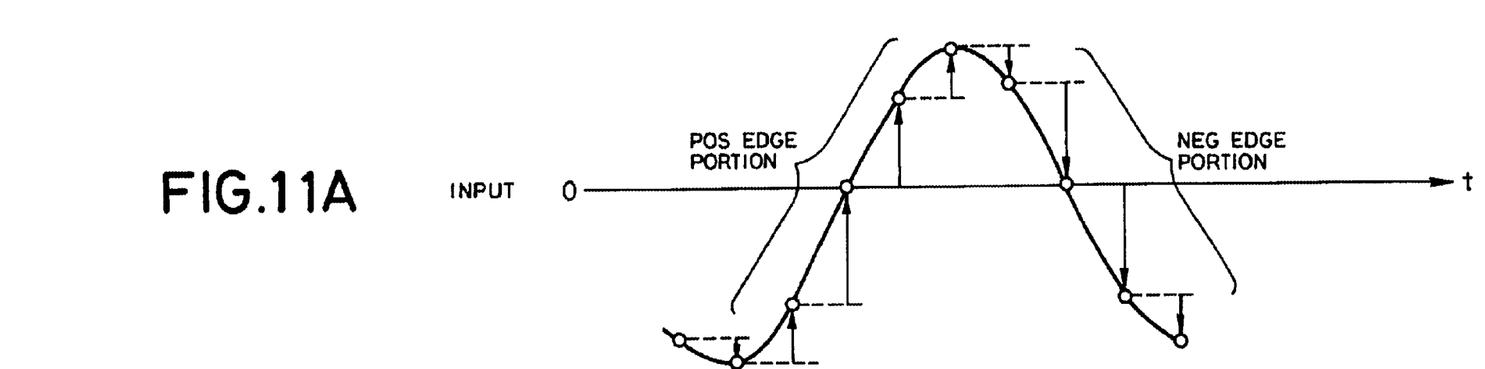
FIGS. 11A to 11D are time charts for explaining the operation of the inclination discriminating circuit in FIG. 10.
Figure 11B:
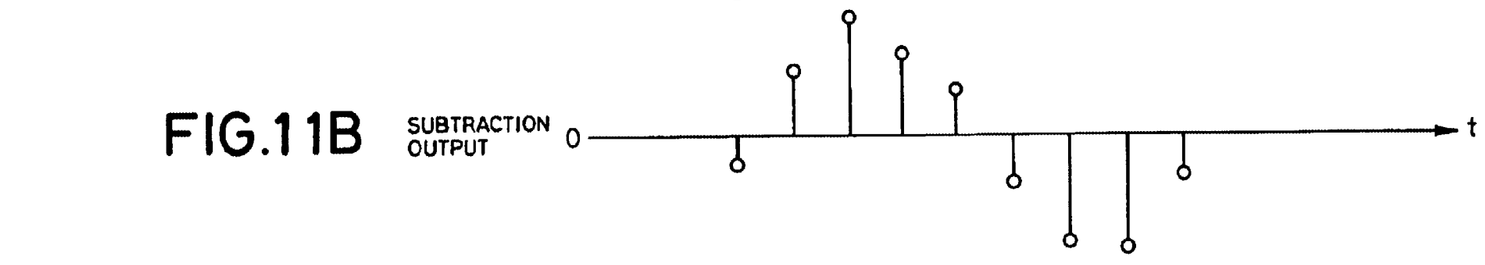
Figures 11C, 11D:
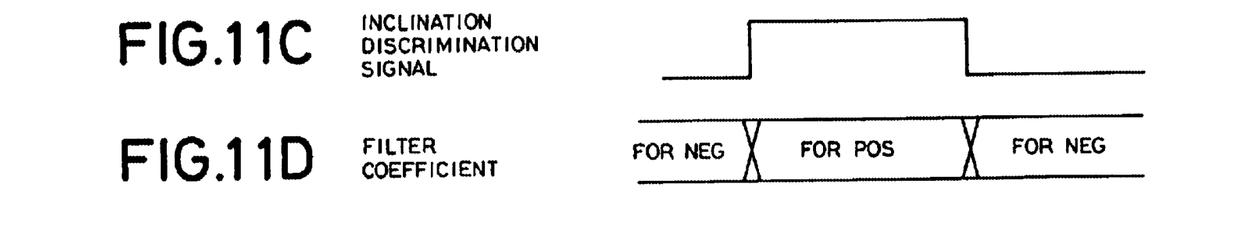

The inclination discriminating circuit 400 can have a specific construction as shown in FIG. 10.

In FIG. 10, the inclination discriminating circuit 400 is constructed by: a unit delay element 401 which receives the sampling value series read signal; a subtractor 402 for subtracting a sampling value of a delay output of the unit delay element 401 from the sampling value of the sampling value series read signal of the input; and a comparator 403 for comparing an output value of the subtractor 402 with a reference value "0".

The actual operation of the inclination discriminating circuit 400 can be expressed by time charts as shown in FIGS. 11A to 11D.

That is, the subtractor 402 generates a value obtained by subtracting the present read signal sampling value from the previous read signal sampling value. Although a subtraction output which is obtained in the POS edge portion has a positive value, a subtraction output which is derived in the NEG edge portion has a negative value. In the comparator 403, therefore, by comparing the value of the subtraction output with zero, the positive/negative polarity can be recognized. An inclination discrimination signal which is set to a logical value "1" when the positive value is recognized and is set to a logical value "0" when the negative value is recognized is generated. As shown in the diagram, the filter coefficients are switched in correspondence to the logical value shown by the inclination discrimination signal.

Figure 12:
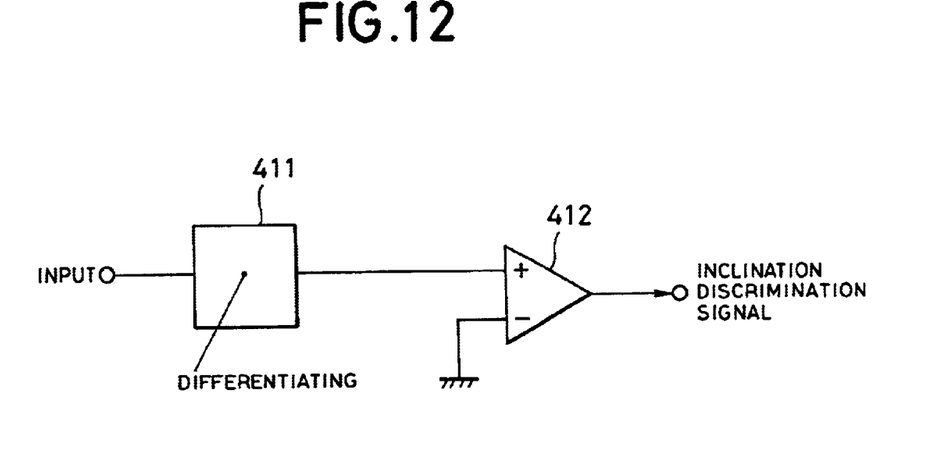
FIG. 12 is a block diagram showing a modification of the inclination discriminating circuit in the waveform equalizer of FIG. 8.

In the case of realizing the inclination discriminating circuit by an analog circuit, it can be constructed as shown in FIG. 12.

Since the read signal is converted to a signal of a waveform according to the inclination by a differentiating circuit 411, a comparator 412 binarizes the waveform converted signal by using the zero level as a threshold value, so that the inclination discrimination signal that is equivalent to that obtained by the construction of FIG. 10 can be generated.

Figure 13:
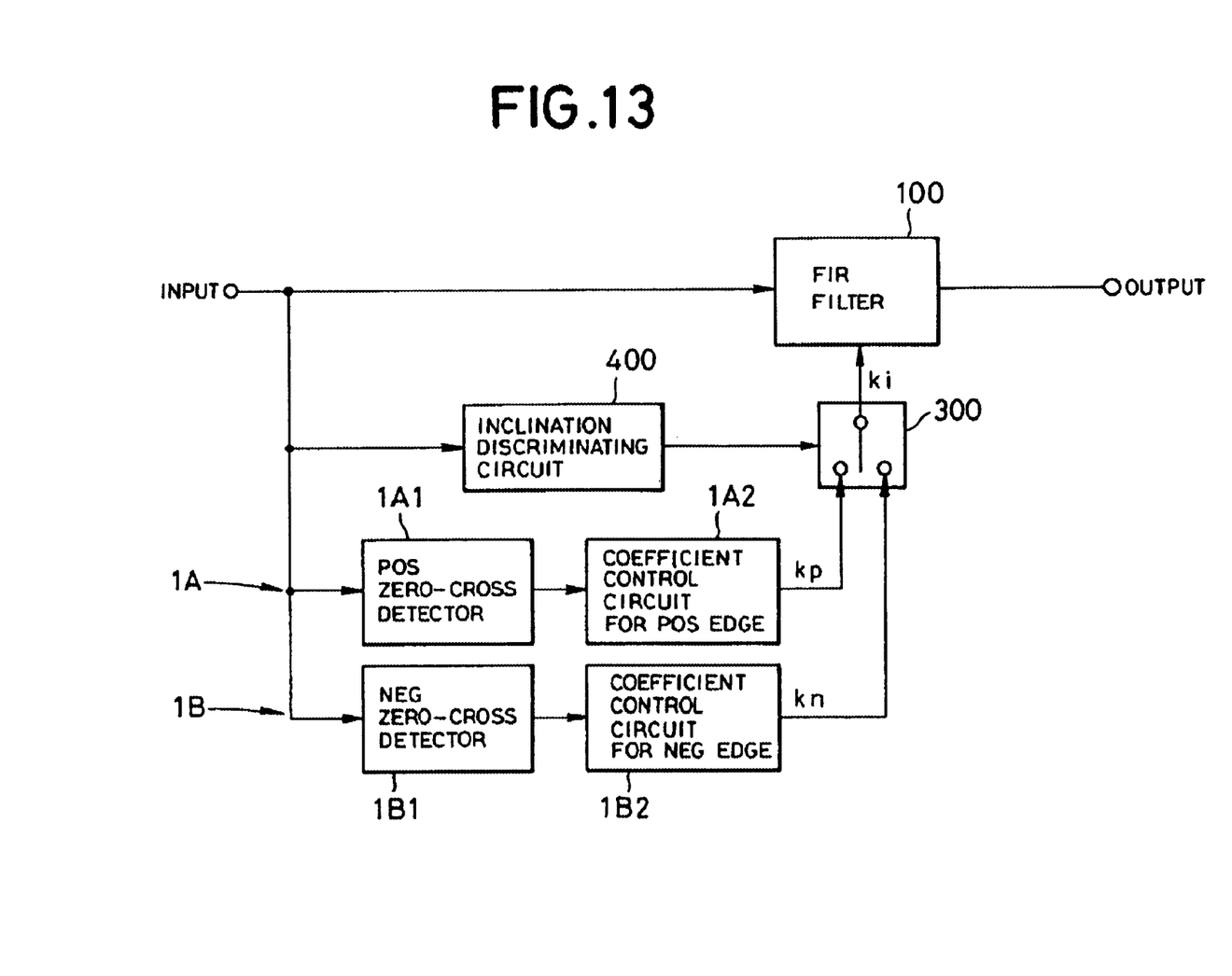
FIG. 13 is a block diagram showing a schematic construction of a waveform equalizer according to the second embodiment constructed in accordance with the construction of FIG. 6.

FIG. 13 shows a construction of a waveform equalizer according to the second embodiment and the portions similar to those in the construction shown in FIG. 8 are designated by the same reference numerals.

In FIG. 8, the inputs of the first and second filter control systems 1A and 1B are obtained from the output of the FIR filter 100. As shown in FIG. 13, however, a construction such that the input signal is set to the inputs of the first and second filter control systems 1A and 1B can be also used.

Even with the above construction, an operation and an effect similar to those of the waveform equalizer shown in FIG. 8 can be also derived.

Figure 14:
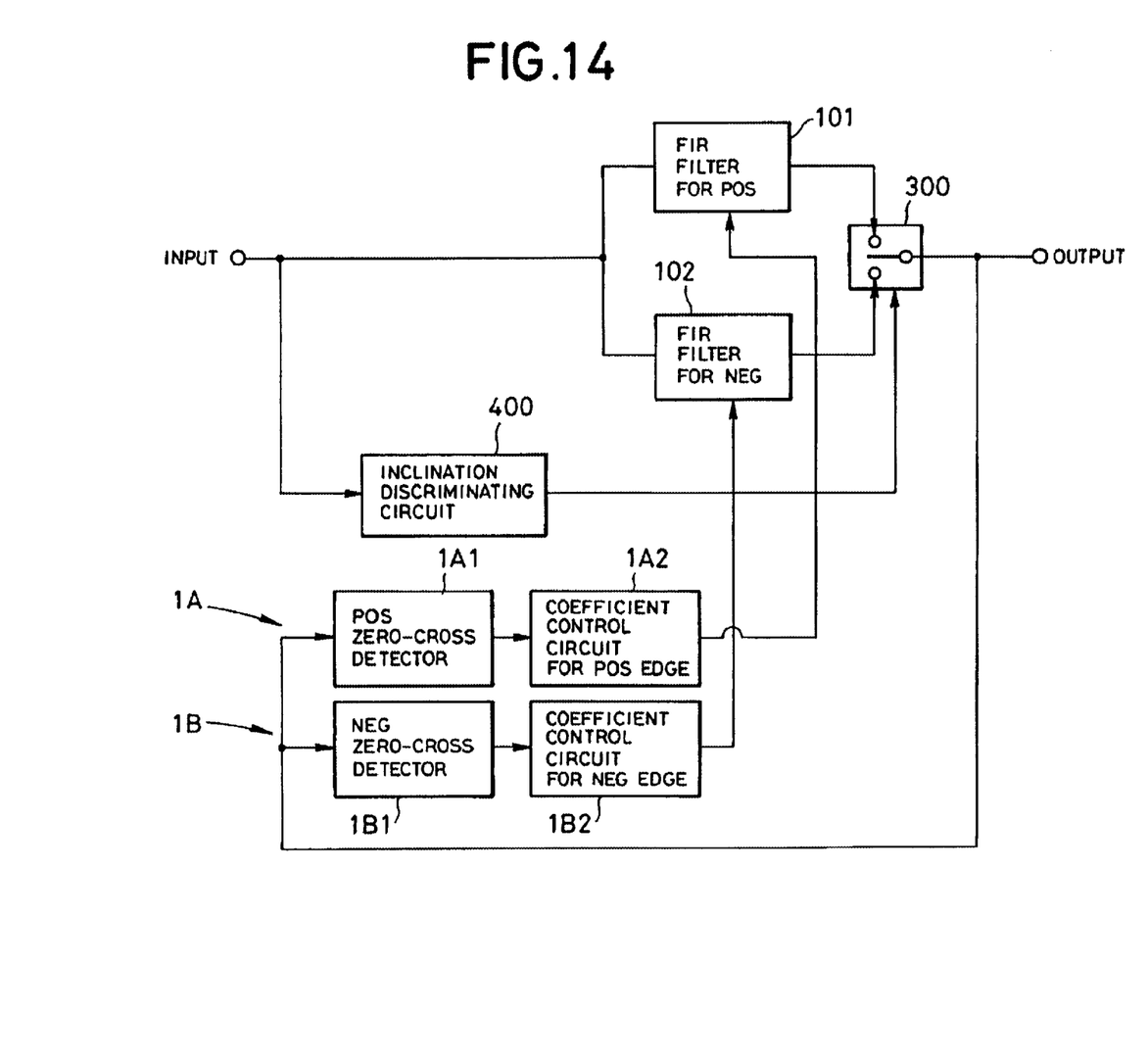
FIG. 14 is a block diagram showing a schematic construction of a waveform equalizer according to the third embodiment constructed in accordance with the construction of FIG. 6.

FIG. 14 shows a construction of a waveform equalizer according to the third embodiment and the portions similar to those in the construction shown in FIG. 8 are also designated by the same reference numerals.

In FIG. 14, the inputs of the first and second filter control systems 1A and 1B are obtained from the output of the FIR filter 100. In place of the single FIR filter 100, two FIR filters of an FIR filter 101 for a POS edge and an FIR filter 102 for an NEG edge are used. Tap coefficients are individually controlled by an output of each corresponding filter control system. The selecting circuit 300, further, selects an output of either one of the FIR filters 101 and 102.

Even with the above construction, an operation and an effect similar to those of the waveform equalizer shown in FIG. 8 can be also derived.

Although the waveform equalizer of the digital form has mainly been described so far, the invention can be also applied to a waveform equalizer of an analog form.

Although the example in which the signal of 3T and the signal of 4T or more are compared to clearly show the problem of the invention has been described, the invention can be also applied to signals of all run lengths irrespective of the signal of 3T and the signal of 4T or more.

The recording medium which is applied, further, is not necessarily limited to the DVD or CD.

Although various means have been limitatively described in each of the above embodiments, many modifications and variations of the invention are possible within the scope where the invention can be designed by those skilled in the art.

As described in detail above, according to the invention, a waveform equalizer which can improve the quality of the read signal by certainly correcting asymmetry in the read signal and a data reproducing apparatus using the waveform equalizer can be provided.

What is claimed is:

1. A waveform equalizer for performing a waveform equalization to a read signal, comprising:

inclination discriminating means for discriminating an ascending slope portion and a descending slope portion of said read signal;

a filter for performing a filtering process to said read signal; and characteristics switching means for switching frequency characteristics of said filter in accordance with a discrimination output of said inclination discriminating means, wherein the inclination discrimination means receives said read signal as an input signal to which said filtering process has not been applied, and wherein said filter has a first filter in which frequency characteristics for said ascending slope portion are set and a second filter in which frequency characteristics for said descending slope portion are set, and said characteristics switching means selects an output signal of either one of said first and second filters and uses the selected output signal as an output signal of the waveform equalizer.

2. An equalizer according to claim 1, wherein said filter is an FIR filter and said characteristics switching means changes values of tap coefficients of said FIR filter, thereby switching said frequency characteristics.

3. An equalizer according to claim 1, wherein said frequency characteristics under the discrimination of said ascending slope portion are set in accordance with a sampling value near a zero-cross point in the ascending slope portion of said corresponding read signal, and said frequency characteristics under the discrimination of said descending slope portion are set in accordance with a sampling value near a zero-cross point in the descending slope portion of said corresponding read signal.

4. An equalizer according to claim 1, wherein said frequency characteristics under the discrimination of said ascending slope portion are set in accordance with a sampling value near a zero-cross point in the ascending slope portion of said corresponding read signal, and said frequency characteristics under the discrimination of said descending slope portion are set in accordance with a sampling value near a zero-cross point in the descending slope portion of said corresponding read signal.

5. An equalizer according to claim 2, wherein said frequency characteristics under the discrimination of said ascending slope portion are set in accordance with a sampling value near a zero-cross point in the ascending slope portion of said corresponding read signal, and said frequency characteristics under the discrimination of said descending slope portion are set in accordance with a sampling value near a zero-cross point in the descending slope portion of said corresponding read signal.

6. A data reproducing apparatus for obtaining reproduction data by binarizing a read signal read out from a recording medium, comprising:

sampling means for forming a sampling value series read signal by sampling said read signal;

a waveform equalizer including inclination discriminating means for discriminating an ascending slope portion and a descending slope portion of said sampling value series read signal, a filter for performing a filtering process to said sampling value series read signal, and characteristics switching means for switching frequency characteristics of said filter in accordance with a discrimination output of said inclination discriminating means, wherein the inclination discrimination means receives said read signal as an input signal to which said filtering process has not been applied, wherein said filter has a first filter in which frequency characteristics for said ascending slope portion are set and a second filter in which frequency characteristics for said descending slope portion are set, and said characteristics switching means selects an output signal of either one of said first and second filters and uses the selected output signal as an output signal of the waveform equalizer; and binarizing means for forming said reproduction data by binarizing an output signal of said waveform equalizer.

7. A waveform equalizer for performing a waveform equalization to a read signal, comprising:

inclination discriminating means for discriminating an ascending slope portion and a descending slope portion of said read signal;

a filter for performing a filtering process to said read signal; and characteristics switching means for switching frequency characteristics of said filter in accordance with a discrimination output of said inclination discriminating means, wherein said filter has a first filter in which frequency characteristics for said ascending slope portion are set and a second filter in which frequency characteristics for said descending slope portion are set, and said characteristics switching means selects an output signal of either one of said first and second filters and uses the selected output signal as an output signal of the waveform equalizer.

8. An equalizer according to claim 7, wherein said frequency characteristics under the discrimination of said ascending slope portion are set in accordance with a sampling value near a zero-cross point in the ascending slope portion of said corresponding read signal, and said frequency characteristics under the discrimination of said descending slope portion are set in accordance with a sampling value near a zero-cross point in the descending slope portion of said corresponding read signal.

9. An equalizer according to claim 7, wherein said filter is an FIR filter and said characteristics switching means changes values of tap coefficients of said FIR filter, thereby switching said frequency characteristics.

10. An equalizer according to claim 9, wherein said frequency characteristics under the discrimination of said ascending slope portion are set in accordance with a sampling value near a zero-cross point in the ascending slope portion of said corresponding read signal, and said frequency characteristics under the discrimination of said descending slope portion are set in accordance with a sampling value near a zero-cross point in the descending slope portion of said corresponding read signal.

* * * * *